US007107552B2

(12) United States Patent
Singh

(10) Patent No.: US 7,107,552 B2
(45) Date of Patent: Sep. 12, 2006

(54) METHOD AND APPARATUS TO ANALYZE NOISE IN A PULSE LOGIC DIGITAL CIRCUIT DESIGN

(75) Inventor: Puneet Singh, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 10/458,458

(22) Filed: Jun. 10, 2003

(65) Prior Publication Data

US 2004/0255255 A1 Dec. 16, 2004

(51) Int. Cl.
*G06F 17/50* (2006.01)

(52) U.S. Cl. .............................................. 716/4; 716/5

(58) Field of Classification Search .................... 716/4, 716/5

See application file for complete search history.

(56) References Cited

U.S. PATENT DOCUMENTS 6,389,578 B1 * 5/2002 McBride ........................ 716/5
6,496,031 B1 * 12/2002 Keller et al. .................. 326/23
6,526,552 B1 * 2/2003 Bosnyak et al. ............... 716/6
6,539,527 B1 * 3/2003 Naffziger et al. .............. 716/5
6,556,962 B1 * 4/2003 Patra ........................... 703/14
6,594,805 B1 * 7/2003 Tetelbaum et al. ............. 716/5
6,711,722 B1 * 3/2004 Parashkevov et al. ......... 716/3
2002/0194573 A1 * 12/2002 Keller et al. ................... 716/5
2004/0164769 A1 * 8/2004 Sung et al. ................... 326/98

* cited by examiner

*Primary Examiner*—Stacy A. Whitmore
(74) *Attorney, Agent, or Firm*—Schwegman, Lundberg, Woessner & Kluth, P.A.

(57) ABSTRACT

A method and apparatus to analyze noise in a pulse logic digital circuit comprising identifying a channel connected component (CCC) in the pulse logic digital circuit design, said CCC comprising a pulse generator. Modifying the pulse logic digital circuit by disconnecting the pulse generator form an input of the CCC in the pulse logic digital circuit design. Turning on the pulse logic digital circuit, inputting a noise signal to the CCC and monitoring an output of the pulse logic digital circuit during the time the pulse logic digital circuit is turn on.

15 Claims, 4 Drawing Sheets

300

305 Identify channel connected component (CCC) in pulse logic digital circuit

310 Disconnect pulse generator from CCC

315 Turn on pulse logic digital circuit

320 Input noise signal for analysis

300

METHOD AND APPARATUS TO ANALYZE NOISE IN A PULSE LOGIC DIGITAL CIRCUIT DESIGN

BACKGROUND

1. Field of the Invention

The present invention is related to the field of circuit design. In particular, the present invention is related to method and apparatus to analyze noise in a pulse logic digital circuit design.

2. Description of the Related Art

Static signal integrity analysis is typically used during the design verification stages of an electronic circuit to ensure the functionality of the silicon comprising the circuit for various electrical noise conditions. A noise problem in the design verification state of the electronic circuit may cause functional errors or may impact the frequency performance of the electronic circuit.

FIG. 1 illustrates an example of a conventional pulse logic digital circuit. Pulse logic circuits are circuits used to maximize the performance of digital circuits and work using a pull-up/pull down network. As illustrated in FIG. 1, the example pulse logic digital circuit 100 comprises a PMOS transistor 105 coupled to NMOS transistors 110–125 as illustrated. The signal value at node N1 is maintained by a keeper circuit comprising back to back inverters 130 and 135 as illustrated. The clock signal CLK is inverted by inverter 140 to form the NCLK signal. The CLK signal and the NCLK signal is input into the gates of transistors 110 and 120 respectively. When CLK is 0 the PMOS transistor 105 is on and precharges node N1 to a logical 1. At this time NMOS 110 is off and therefore, the voltage value at N1 is maintained at 1. Assuming a logical 1 at inputs A and B of NMOS transistors 115 and 125 respectively, during the transition of CLK from 0 to 1, NMOS transistor 110 is turned on and NMOS transistor 120 is turns off after an inverter delay. Thus, during the inverter delay all NMOS transistors 110–125 are turned on, discharging node N1 to a logical 0, and this results in a logical 1 at the output of the keeper. Thus, for the circuit of FIG. 1, only when both transistors 115 and 125 have a 1 bat their inputs the output of the pulse logic digital circuit is a 1.

Conventional verification tools are incapable of accurately analyzing pulse logic digital circuits because the conventional verification tools either simplify the circuit to an equivalent circuit or are unable to generate a steady state stimuli condition which tests the node N1 under evaluation conditions. For example, the conventional verification tools may simplify FIG. 1 to an AND gate coupled to a latch and apply steady state signals to inputs of the equivalent circuit to analyze noise effects. Simplifying and/or analyzing pulse logic digital circuits using steady state signals is inaccurate, because during normal operation, the pulse logic digital circuits latch the signals at node N1 during the inverter delay i.e., during a transition of the CLK signal as illustrated with respect to FIG. 1. Thus, conventional verification tools fail to indicate problems such as noise related failures in pulse logic digital circuits.

BRIEF SUMMARY OF THE DRAWINGS

Example embodiments of the present invention are illustrated in the accompanying drawings. The accompanying drawings, however, do not limit the scope of the present invention. Similar references in the drawings indicate similar elements.

DETAILED DESCRIPTION

Described is a method and apparatus to analyze noise in a pulse logic digital circuit design comprising identifying a channel connected component (CCC) in the pulse logic digital circuit design, said CCC comprising a pulse generator. Modifying the pulse logic digital circuit by disconnecting the pulse generator form an input of the CCC in the pulse logic digital circuit design. Turning on the pulse logic digital circuit, inputting a noise signal to the CCC and monitoring an output of the pulse logic digital circuit during the time the pulse logic digital circuit is turned on.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 1:
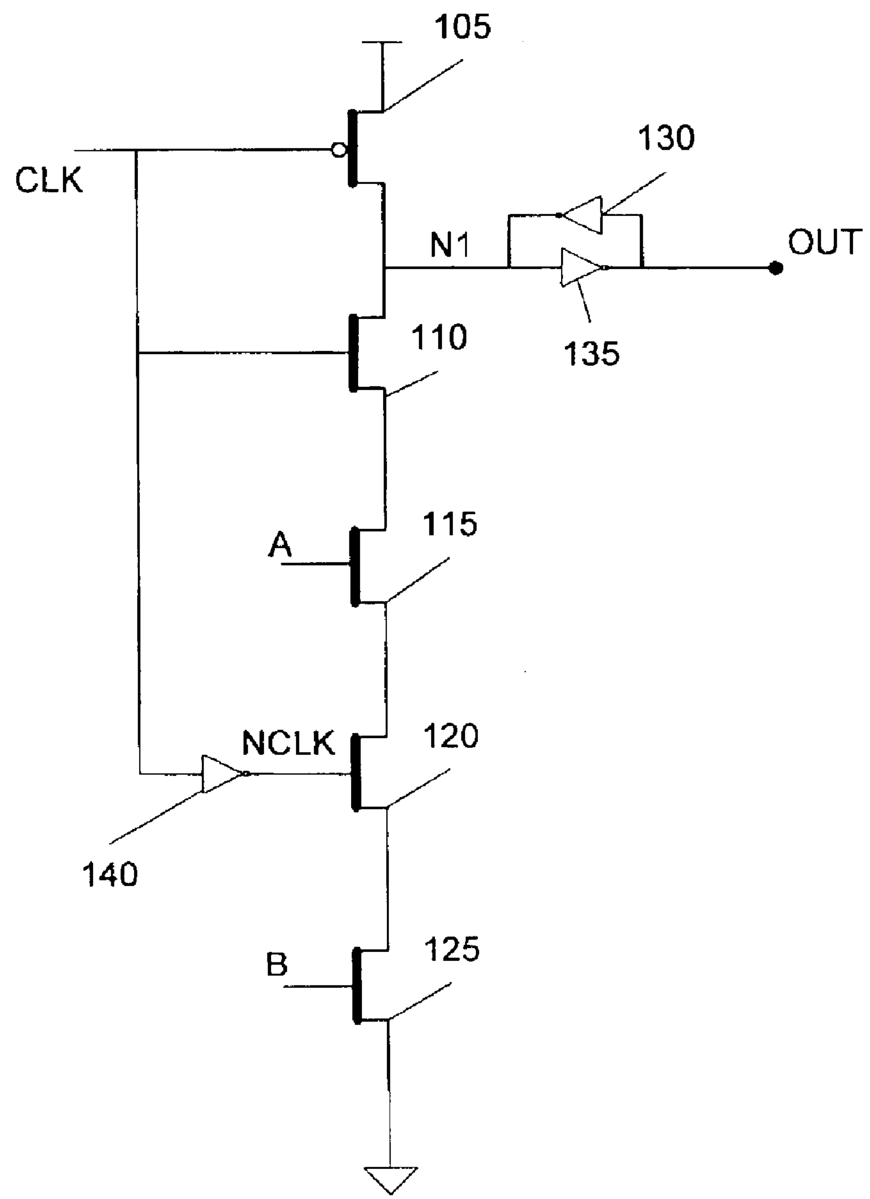
FIG. 1 illustrates a conventional pulse logic digital circuit.
Figure 2:
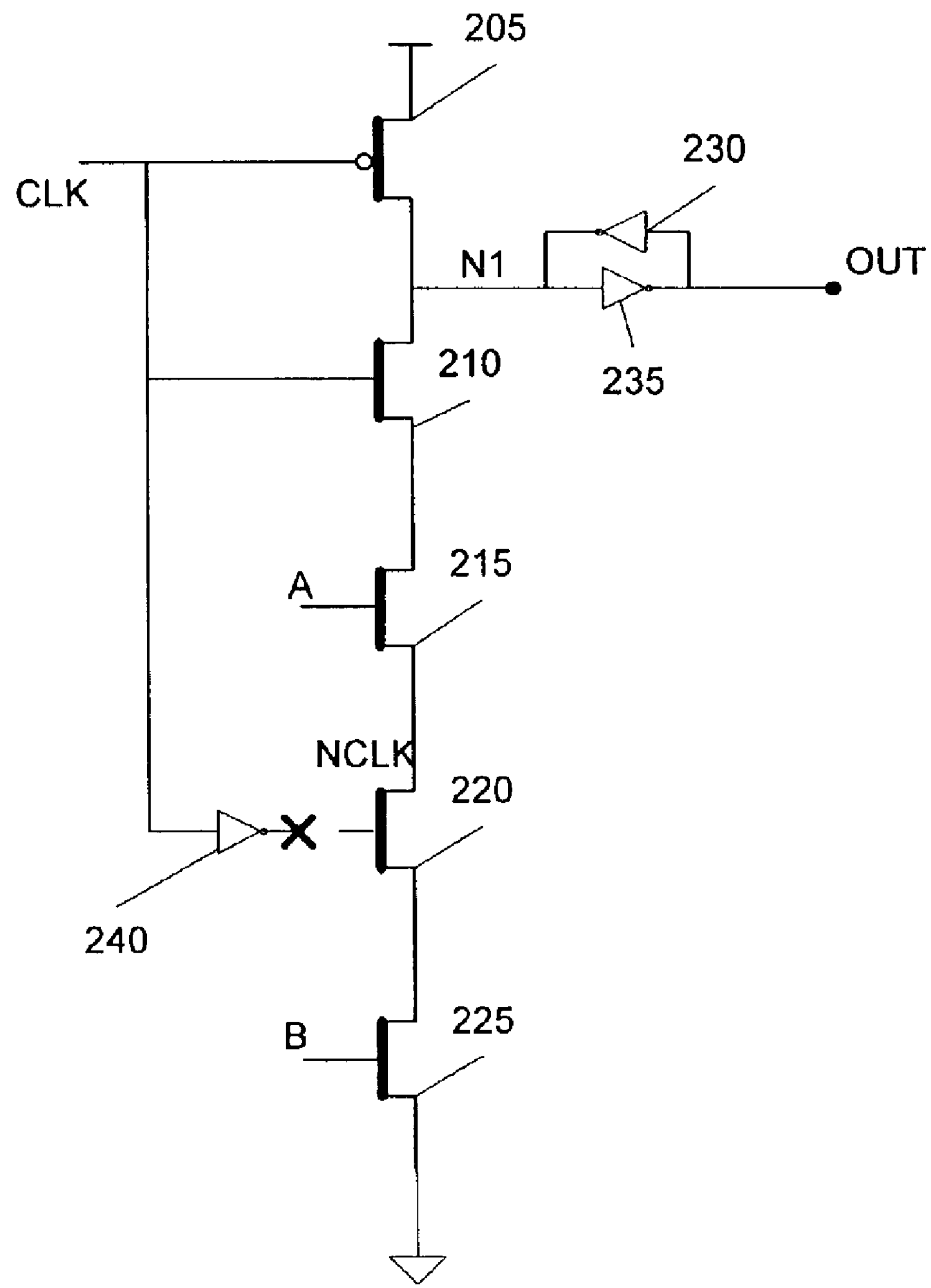
FIG. 2 illustrates modifying the pulse logic digital circuit by disconnecting the pulse generator from an input of the channel connected component according to one embodiment of the invention.
Figure 3:
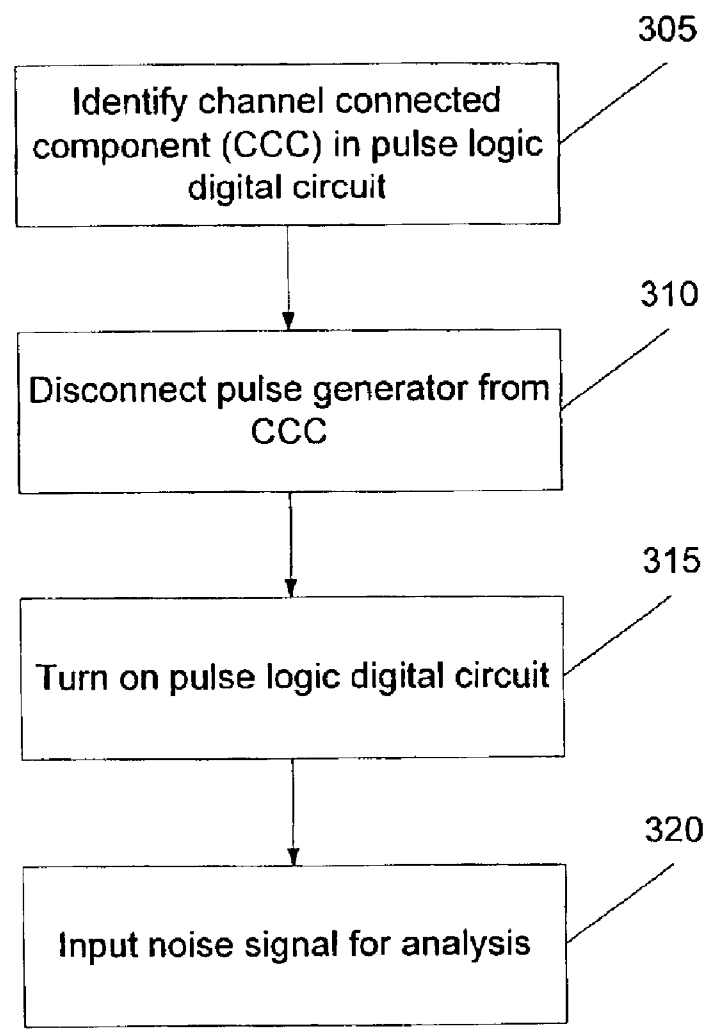
FIG. 3 illustrates a flow diagram for analyzing noise in a pulse logic digital circuit according to one embodiment of the invention.

FIG. 2 illustrates modifying the pulse logic digital circuit by disconnecting the pulse generator from an input of the channel connected component according to one embodiment of the invention. FIG. 3 illustrates a flow diagram for analyzing noise in a pulse logic digital circuit according to one embodiment of the invention. FIG. 2 illustrates the example pulse logic digital circuit of FIG. 1 with the connection of the gate on NMOS transistor 220 disconnected. Noise may be defined as an unwanted signal having an AC and/or DC component that hinders the operation of the pulse logic digital circuit. The pulse logic digital circuit use pulse generators to generate a pulse (pulse circuitry is not shown) that is coupled to the pulse logic digital circuit. The pulse generator controls the pulse characteristics (i.e., the pulse width). In order to analyze noise in a pulse logic digital circuit, as FIG. 3 illustrates, at 305, the pulse logic digital circuit with a pulse generator coupled to the pulse logic digital circuit is identified. In order to identify a pulse logic digital circuit, in one embodiment of the invention, the keeper circuit is identified. Identifying the keeper circuit comprises identifying the back to back inverters 230–235. In one embodiment of the invention, after identifying the keeper circuit, the clock driven pre-charge circuit is identified. In FIG. 2, identifying the pre-charge circuit comprises identifying a clock driven PMOS transistor coupled to the keeper circuit. Thus, pre-charge circuit is 205 is identified.

Thereafter, channel connected components (CCCs), coupled with the pulse generator are identified. CCCs are well known to one having ordinary skill in the art and basically comprise transistors wherein the channels of the transistors are coupled to each other. In one embodiment the CCCs coupled with the pulse generator are identified by recognizing the existence of a mutually exclusive condition for the transistors that are coupled to the pulse generator of the CCC. In particular, a determination is made whether given a CCC, for a steady state condition the transistors that control the channel of the CCC (i.e., transistors 210 and 220 in FIG. 2) are not on at the same time. In FIG. 2, for steady state inputs, when the CLK signal is a 1, the inverted clock signal (i.e., NCLK) is a 0. Therefore, when NMOS transistor 210 is on, NMOS transistor 220 off . When the clock signal changes from a 1 to a 0, NMOS transistor 210 is off and NMOS transistor 220 is turned on. Thus, a CCC coupled with a pulse generator is identified.

Once the CCC coupled with the pulse generator is identified, in one embodiment of the invention, at 310, the pulse generator connection at the gate of NMOS transistor 220 is disconnected as illustrated in FIG. 2. This allows a signal to be input into the gates of the transistors (transistors 210 and 220) so that the CCC transistors may be turned on simultaneously. In one embodiment of the invention, the pulse generator connection at 210 may be disconnected from the gate of the transistor to allow a signal to be input into the gates of the transistors (210 and 220) to turn on the transistors simultaneously. By turning on the transistors simultaneously, e.g., by an input pulse having the pulse width as the pulse generated by the pulse generator that turns on the transistor during its normal operation, a more accurate analysis of the noise associated with pulse logic digital circuit may be performed.

In one embodiment of the invention, at 320, the NMOS transistors (210 and 220) of the CCC are turned on and inputs A and B are enabled to simulate actual voltages and signal fluctuations encountered during the operation of the pulse logic digital circuit. In one embodiment of the invention, to maintain the equivalent impedance at the gate of NMOS transistor 220, an impedance equivalent to the output impedance of the local pulse generator is coupled to the gate of the NMOS transistor 220 prior to turning on the NMOS transistors.

Thus in one embodiment of the invention, the node N1 may be pre-charged to a logic 1 prior to evaluating a noise signal. During evaluation of the noise signal, in one embodiment of the invention, NMOS transistor 210 may be turned on by inputting a 1 at its gate. The other inputs e.g., the gates of transistors 215–225 are treated as free inputs to enable worst case propagated, interconnect, and charge sharing noise analysis. Noise analysis as illustrated above also permits to adjust the float simulation time of node N1. The float simulation time is the time during which node N1 is tri-stated. This may occur when NMOS transistor 220 is turned off.

Figure 4:
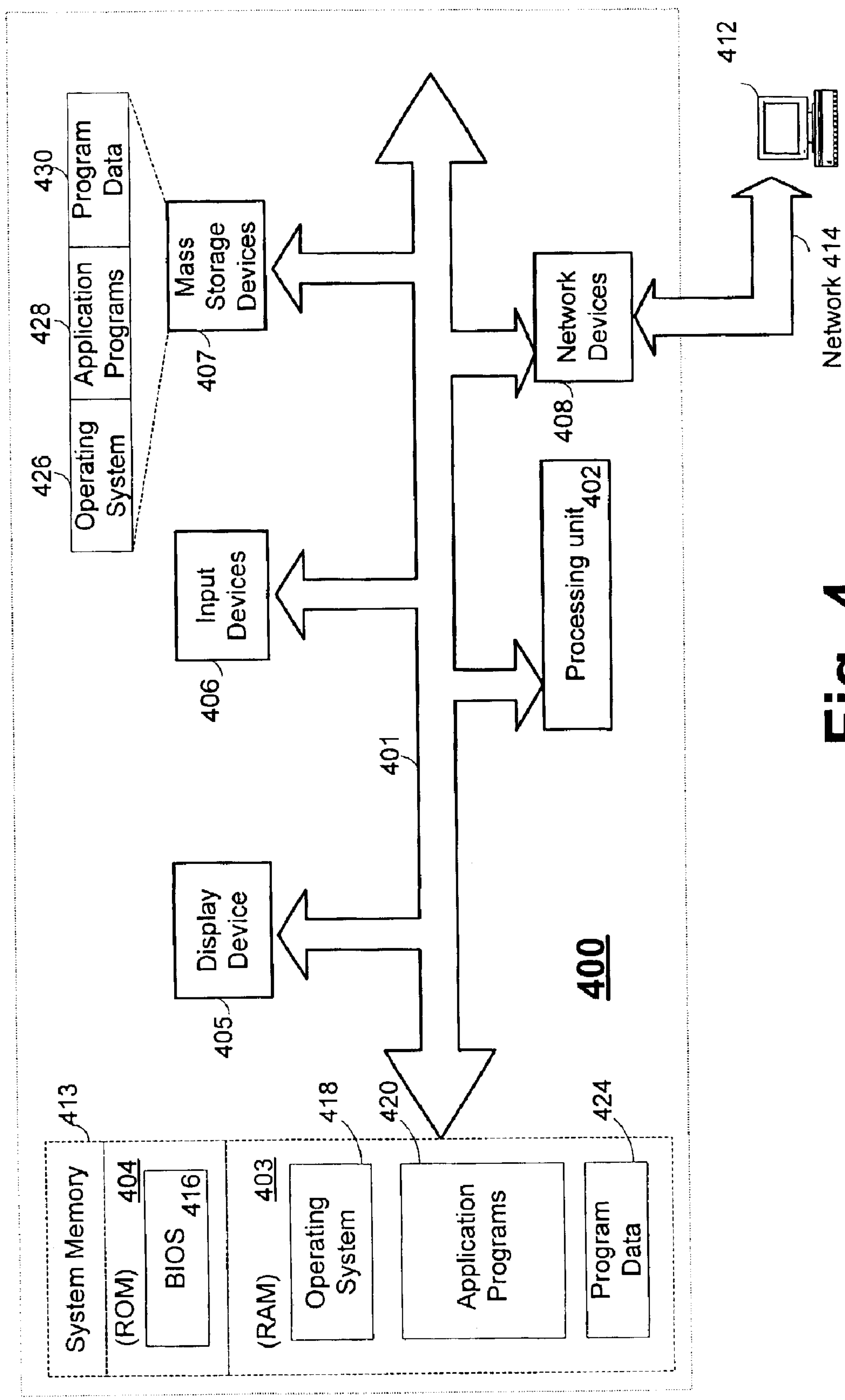
FIG. 4 illustrates a computer system for analyzing noise in a pulse logic digital circuit according to one embodiment of the invention.

FIG. 4 illustrates a computer system for analyzing noise in a pulse logic digital circuit according to one embodiment of the invention. In general, the computer system 400 may comprise a processing unit 402 communicatively coupled through a bus 401 to system memory 413, mass storage devices 407, Input devices 406, display device 405 and network devices 408.

Bus 401 may be any of several types of bus structures including a memory bus, a peripheral bus, and a local bus using any of a variety of bus architectures. System memory 413 comprises a read only memory (ROM) 404 and random access memory (RAM) 403. ROM 404 comprises basic input output system (BIOS) 416. BIOS 416 contain the basic routines, e.g., start up routines, that facilitate the transfer of information between elements within computer system 400. RAM 403 includes cache memory and comprises operating system 418, application programs 420, and program data 424. Application programs 420 include the program code for implementing the method described with respect to FIGS. 2–3 above. Program data 424 may include data generated by application programs 420. Mass storage device 407 represents a persistent data storage device, such as a floppy disk drive, fixed disk drive (e.g., magnetic, optical, magneto-optical, or the like), or streaming tape drive. Mass storage device 407 may store application programs 428, operating system 426 for computer system 400, and program data 430. Application programs 428 and program data 430 stored on mass storage devices 407 may include the application programs 420 and program data 424 stored in RAM 403. One embodiment of the invention may be stored entirely as a software product on mass storage device 407. Embodiments of the invention may be represented as a software product stored on a machine-readable medium (also referred to as a computer-accessible medium, a machine-accessible medium, or a processor-accessible medium). The machine-readable medium may be any type of magnetic, optical, or electrical storage medium including a diskette, CD-ROM, memory device (volatile or non-volatile), or similar storage mechanism. The machine-readable medium may contain various sets of instructions, code sequences, configuration information, or other data. Those of ordinary skill in the art will appreciate that other instructions and operations necessary to implement the described invention may also be stored on the machine-readable medium. One embodiment of the invention may be embedded in a hardware product, for example, in a printed circuit board, in a special purpose processor, or in a specifically programmed logic device communicatively coupled to bus 401. Processing unit 402 may be any of a wide variety of general-purpose processors or microprocessors (such as the Pentium® processor family manufactured by Intel® Corporation), a special purpose processor, or a specifically programmed logic device. Processing unit 402 is operable to receive instructions which, when executed by the processing unit cause the processing unit to execute application programs 420.

Display device 405 is coupled to processing unit 402 through bus 401 and provides graphical output for computer system 400. Input devices 406 such as a keyboard or mouse are coupled to bus 401 for communicating information and command selections to processing unit 402. Other input devices may include a microphone, joystick, game pad, scanner, or the like. Also coupled to processing unit 402 through bus 401 is an input/output interface (not shown) which can be used to control and transfer data to electronic devices (printers, other computers, etc.) connected to computer system 400. Computer system 400 includes network devices 408 for connecting computer system 400 to one or more remote devices (e.g., the receiving node) 412 via network 414. Remote device 412 may be another personal computer, a server, a router, a network PC, a wireless device or other common network node and typically includes one or more of the elements described above with respect to computer system 400. Network devices 408, may include a network interface for computer system 400, Ethernet devices, network adapters, phone jacks, modems, and satellite links. It will be apparent to one of ordinary skill in the art that other network devices may also be utilized.

Thus, a method and apparatus for analyzing noise in a pulse logic digital circuit has been disclosed. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. An method for analyzing noise in a pulse logic digital circuit design comprising:

identifying a channel connected component (CCC) in the pulse logic digital circuit design, said CCC comprising a pulse generator;

modifying the pulse logic digital circuit by disconnecting the pulse generator from an input of the CCC in the pulse logic digital circuit design;

turning on the pulse logic digital circuit; and inputting a noise signal to the CCC and monitoring an output of the pulse logic digital circuit during the time the pulse logic digital circuit is turned on.

2. The method of claim 1 wherein identifying a CCC in the pulse logic digital circuit design, said CCC comprising a local pulse generator comprises the local pulse generator coupled to at least one gate of one or more transistors comprising the CCC.

3. The method of claim 2 wherein identifying a CCC comprises identifying the one or more transistors comprising the CCC, such that for steady state voltages input to the CCC, if a first transistor comprising the CCC is on then a second transistor comprising the CCC is off prior to the modification of the pulse logic digital circuit design.

4. The method of claim 1 wherein modifying the pulse logic digital circuit by disconnecting the local pulse generator form an input of the CCC in the pulse logic digital circuit design comprises adding an impedance equivalent to the output impedance of the local pulse generator to an input of the CCC.

5. The method of claim 1 wherein turning on the pulse logic digital circuit comprises turning on at least two transistors comprising the CCC for alternating current and direct current noise analysis.

6. An apparatus to analyze noise in a pulse logic digital circuit comprising:

a memory;

a processor; and a bus coupled to the memory and the processor, the processor to identify a channel connected component (CCC) in the pulse logic digital circuit design, said CCC comprising a pulse generator;

modify the pulse logic digital circuit by disconnecting the pulse generator from an input of the CCC in the pulse logic digital circuit design;

turn on the pulse logic digital circuit;

input a noise signal to the CCC; and monitor an output of the pulse logic digital circuit during the time the pulse logic digital circuit is turned on.

7. The apparatus of claim 6 wherein the processor to identify a CCC in the pulse logic digital circuit design, said CCC comprising a local pulse generator comprises the processor to identify a local pulse generator coupled to at least one gate of one or more transistors comprising the CCC.

8. The apparatus of claim 7 wherein the processor to identify a CCC comprises the processor to identify the one or more transistors comprising the CCC, such that for steady state voltages input to the CCC, if a first transistor comprising the CCC is on then a second transistor comprising the CCC is off prior to the modification of the pulse logic digital circuit design.

9. The apparatus of claim 6 wherein the processor to modify the pulse logic digital circuit by disconnecting the local pulse generator form an input of the CCC in the pulse logic digital circuit design comprises the processor to add an impedance equivalent to the output impedance of the local pulse generator to an input of the CCC.

10. The apparatus of claim 6 wherein the processor to turn on the pulse logic digital circuit comprises the processor to turn on at least one transistor comprising the CCC for alternating current and direct current noise analysis.

11. An article of manufacture for inserting a flip-flop in a circuit design between a driver and a receiver comprising:

a machine-accessible medium including instructions that, when executed by a machine, causes the machine to perform operations comprising identifying a channel connected component (CCC) in the pulse logic digital circuit design, said CCC comprising a pulse generator;

modifying the pulse logic digital circuit by disconnecting the pulse generator from an input of the CCC in the pulse logic digital circuit design;

turning on the pulse logic digital circuit; and inputting a noise signal to the CCC and monitoring an output of the pulse logic digital circuit during the time the pulse logic digital circuit is turned on.

12. The article of manufacture of claim 11 wherein said instructions for identifying a CCC in the pulse logic digital circuit design, said CCC comprising a local pulse generator comprises further instructions for identifying the local pulse generator coupled to at least one gate of one or more transistors comprising the CCC.

13. The article of manufacture of claim 12 wherein said instructions for identifying a CCC comprises further instructions for identifying the one or more transistors comprising the CCC, such that for steady state voltages input to the CCC, if a first transistor comprising the CCC is on then a second transistor comprising the CCC is off prior to the modification of the pulse logic digital circuit design.

14. The article of manufacture of claim 11 wherein said instructions for modifying the pulse logic digital circuit by disconnecting the local pulse generator form an input of the CCC in the pulse logic digital circuit design comprises further instructions for adding an impedance equivalent to the output impedance of the local pulse generator to an input of the CCC.

15. The article of manufacture of claim 11 wherein said instructions for turning on the pulse logic digital circuit comprises further instructions for turning on at least two transistors comprising the CCC for alternating current and direct current noise analysis.

* * * * *

UNITED STATES PATENT AND TRADEMARK OFFICE

CERTIFICATE OF CORRECTION

PATENT NO. : 7,107,552 B2
APPLICATION NO. : 10/458458
DATED : September 12, 2006
INVENTOR(S) : Singh It is certified that error appears in the above-identified patent and that said Letters Patent is hereby corrected as shown below:

In column 5, line 24, in Claim 1, delete "An" and insert -- A --, therefor.

In column 6, line 31, in Claim 11, after "comprising" insert -- ; --.

Signed and Sealed this

Thirtieth Day of December, 2008

JON W. DUDAS
*Director of the United States Patent and Trademark Office*